United States Patent
Ripley et al.

(10) Patent No.: US 7,414,479 B2
(45) Date of Patent: *Aug. 19, 2008

(54) AUTOMATIC BIAS CONTROL CIRCUIT FOR REDUCED CURRENT CONSUMPTION IN A LINEAR POWER AMPLIFIER

(75) Inventors: David S. Ripley, Cedar Rapids, IA (US); Paul R. Andrys, Swisher, IA (US); Keith Nellis, Calabasas, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/903,406

(22) Filed: Sep. 21, 2007

(65) Prior Publication Data

US 2008/0007341 A1  Jan. 10, 2008

Related U.S. Application Data

(63) Continuation of application No. 11/172,490, filed on Jun. 29, 2005, now Pat. No. 7,276,973.

(51) Int. Cl.
*H03F 3/04* (2006.01)
*H03G 3/30* (2006.01)

(52) U.S. Cl. .................................. 330/296; 330/285

(58) Field of Classification Search ................ 330/279, 330/285
See application file for complete search history.

(56) References Cited

U.S. PATENT DOCUMENTS

| | | | | |
|---|---|---|---|---|
| 5,311,143 A * | 5/1994 | Soliday | ...................... | 330/127 |
| 6,784,740 B1 * | 8/2004 | Tabatabaei | .................. | 330/279 |
| 7,049,891 B2 * | 5/2006 | Yuen | .......................... | 330/285 |

\* cited by examiner

*Primary Examiner*—Steven J Mottola
(74) *Attorney, Agent, or Firm*—Farjami & Farjami LLP

(57) ABSTRACT

According to an exemplary embodiment, an amplification module includes a power amplifier configured to receive an RF input signal and provide an RF output signal. The amplification module further includes an autobias control circuit configured to receive and convert the RF output signal to a control signal. The control signal can cause the power amplifier to have a quiescent current that increases substantially linearly in response to an increase in the RF output power of the RF output signal. The autobias control circuit can include a peak detector/log converter circuit coupled to a first input of a differential amplifier, where the differential amplifier outputs the control signal. The autobias control circuit can further include a DC reference circuit coupled to a second input of the differential amplifier. The amplification module further includes an analog bias circuit coupling the control voltage to a bias input of said power amplifier.

20 Claims, 2 Drawing Sheets

AUTOMATIC BIAS CONTROL CIRCUIT FOR REDUCED CURRENT CONSUMPTION IN A LINEAR POWER AMPLIFIER

BACKGROUND OF THE INVENTION

This is a continuation of application Ser. No. 11/172,490 filed Jun. 29, 2005 now U.S. Pat. No. 7,276,973.

1. Field of the Invention

The present invention is generally in the field of electrical circuits. More particularly, the invention is in the field of power amplifiers.

2. Background Art

Power amplifiers, such as linear power amplifiers used in cellular handsets, are required to maintain a minimum specified linearity, which is defined by the Federal Communications Commission ("FCC") or by customer specifications. Since linear power amplifiers, such as linear power amplifiers used in cellular handsets as well as other wireless applications typically consume a significant amount of battery power, they are generally designed to draw the least amount of current possible. However, the goal of minimum current consumption must be achieved while meeting the minimum specified linearity requirements. Since it is difficult to meet linearity requirements at the highest output power that the linear power amplifier is required to deliver, a conventional linear power amplifier used in cellular handsets is typically optimized so that it meets the linearity requirement at the highest output power level while consuming the least amount of current. As a result, the conventional linear power amplifier can significantly exceed the minimum specified linearity requirements at low output power levels.

However, since there is typically a tradeoff between current consumption and linearity (i.e. an increase or decrease in linearity is typically accompanied by a respective increase or decrease in current consumption), the conventional linear power amplifier can consume more current than is necessary at low power output levels. By consuming excessive current at lower power output levels, the conventional linear power amplifier, such as a conventional linear power amplifier used in cellular handsets as well as other wireless devices, can cause an undesirable reduction in battery life.

Thus, there is a need in the art for an effective means for reducing current consumption at low power output levels in a linear power amplifier, such as a linear power amplifier used in a cellular handset.

SUMMARY OF THE INVENTION

The present invention is directed to an automatic bias control circuit for linear power amplifiers. The present invention addresses and resolves the need in the art for an effective means for reducing current consumption at low power output levels in a linear power amplifier, such as a linear power amplifier used in a cellular handset.

According to an exemplary embodiment, an amplification module includes a power amplifier configured to receive an RF input signal and provide an RF output signal. The power amplifier can be a linear power amplifier. The amplification module further includes an autobias control circuit configured to receive and convert the RF output signal to a control signal. The control signal can cause the power amplifier to have a quiescent current that increases substantially linearly in response to an increase in the RF output power of the RF output signal. The control signal can be linearly proportional to an RF output power of the RF output signal, where the RF output power is measured in dBm. The autobias control circuit can include a peak detector/log converter circuit coupled to a first input of a differential amplifier, where the differential amplifier outputs the control voltage.

According to this exemplary embodiment, the autobias control circuit can further include a DC reference circuit coupled to a second input of the differential amplifier, wherein the DC reference circuit includes a number of components, wherein each of the components is matched to a corresponding component in the peak detector/log converter circuit. The amplification module further includes a bias circuit coupling the control signal to a bias input of said power amplifier. The bias circuit can be configured to receive the control signal and provide a bias voltage to the bias input of the power amplifier, where the bias voltage is linearly proportional to the control signal. Other features and advantages of the present invention will become more readily apparent to those of ordinary skill in the art after reviewing the following detailed description and accompanying drawings.

DETAILED DESCRIPTION OF THE INVENTION

The present invention is directed to an automatic bias control circuit for power amplifiers. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
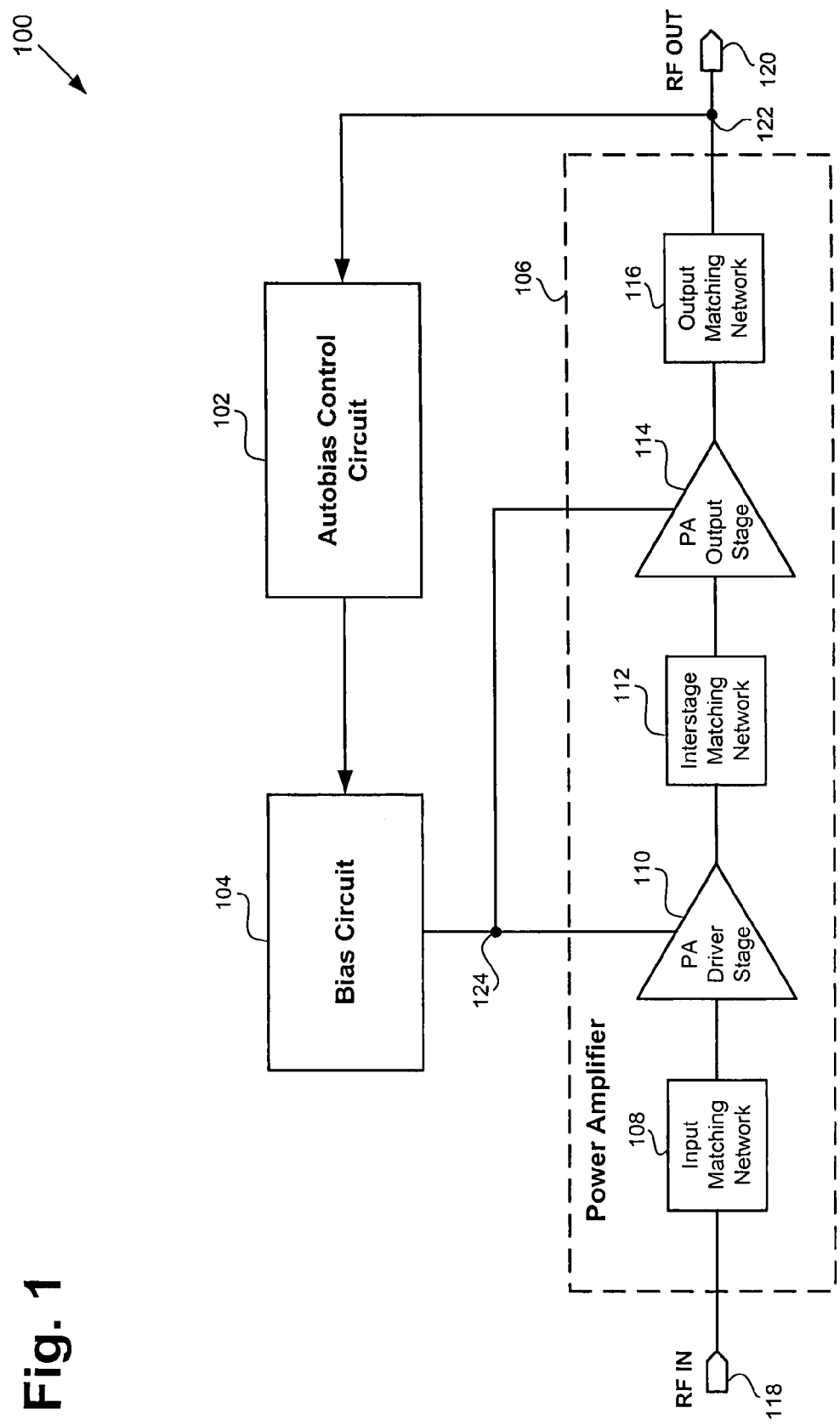
FIG. 1 is a block diagram of an exemplary automatic bias control circuit coupled to an exemplary power amplifier in accordance with one embodiment of the present invention.

FIG. 1 shows a block diagram of an exemplary amplification module including an exemplary automatic bias control circuit, an exemplary analog bias circuit, and an exemplary power amplifier in accordance with one embodiment of the present invention. Certain details and features have been left out of FIG. 1, which are apparent to a person of ordinary skill in the art. Amplification module 100 includes automatic bias ("autobias") control circuit 102, bias circuit 104, and power amplifier 106. Power amplifier 106 includes input matching network 108, power amplifier driver stage 110, interstage matching network 112, power amplifier output stage 114, and output matching network 116. It is noted that although power amplifier 106 only includes only two amplification stages (i.e. power amplifier driver stage 110 and power amplifier output state 114) in the present application, the present invention also applies to a power amplifier having more than two amplification stages.

Amplification module 100 can be used in wireless communication devices, such as cellular handsets using for example, code-division multiple access ("CDMA"), time-division multiple access ("TDMA"), or other wireless communication standard that requires a linear power amplifier. Amplification module 100 can be fabricated on a semiconductor die using silicon technology, gallium arsenide ("GaAs") technology, or other appropriate technologies.

As shown in FIG. 1, RF input signal ("RF IN") 118 is coupled to the input of input matching network 108 at the RF input of power amplifier 106. Power amplifier 106 can be configured to receive RF IN 118 and a bias voltage at node 124, amplify RF IN 118, and generate an RF output signal ("RF OUT") 120. Power amplifier 106 comprises a linear power amplifier, which may be used in a wireless communications device, such as a cellular handset, as well as other applications that require a linear power amplifier. Also shown in FIG. 1, the output of input matching network 108 is coupled to the input of power amplifier driver stage 110. Matching network 108 can be configured to match the output impedance of a circuit (not shown in FIG. 1) that provides RF IN 118 to the input impedance of power amplifier driver stage 110. Power amplifier driver stage 110 can be configured to receive RF IN 118 from input matching network 108 and a bias voltage from bias circuit 104, amplify RF IN 118, and output an intermediate RF signal to the input of interstage matching network 112.

Further shown in FIG. 1, the output of interstage matching network 112 is coupled to the input of power amplifier output stage 114. The interstage matching network transforms the input impedance of the output stage to the desired PA driver stage load line. Also shown in FIG. 1, the output of power amplifier output stage 114 is coupled to output matching network 116. Power amplifier output stage 114 can be configured to receive the intermediate RF signal from interstage matching network 112, a bias voltage outputted by bias circuit 104, amplify the intermediate RF signal, and generate RF OUT 120. Further shown in FIG. 1, output matching network 116 couples the output of power amplifier output stage 114 to a load (not shown in FIG. 1), such as an antenna. The output matching network transforms the load impedance (not shown in FIG. 1) to the desired PA output stage load line.

Further shown in FIG. 1, the input of autobias control circuit 102 is coupled to the output of power amplifier 106 at node 122. In the present invention, autobias control circuit 102 can be configured to receive an RF output signal (i.e. RF OUT 120) from power amplifier 106 and output a control signal, which is linearly proportional to the RF output power (in dBm) of RF OUT 120. In the present embodiment, the control signal outputted by autobias control circuit 102 can be a control voltage. In another embodiment, the control signal may be a control current. In the present embodiment, autobias control circuit 102 can be implemented utilizing silicon technology. In other embodiments, autobias control circuit 102 may be implemented using GaAs technology or other appropriate technology. Also shown in FIG. 1, the control signal provided at the output of autobias control circuit 102 is coupled to the input of bias circuit 104, and the output of bias circuit 104 is coupled to the bias inputs of power amplifier driver stage 110 and power amplifier output stage 114 of power amplifier 106 at node 124.

Bias circuit 104 can be configured to receive a control signal outputted by autobias control circuit 102 and appropriately adjust the quiescent current of power amplifier 106 according to the control signal. Bias circuit 104 can also be configured to provide a bias voltage to power amplifier 106 (i.e. power amplifier driver stage 110 and power amplifier output stage 114 of power amplifier 106) that varies linearly with respect to a control signal inputted into bias circuit 104. Since the control voltage received from autobias control circuit 102 is linearly proportional to the RF output power (in dBm) of RF OUT 120, bias circuit 104 causes power amplifier 106 to have a quiescent current that increases substantially linearly in response to an increase in RF output power (in dBm) of RF OUT 120 (i.e. the RF output signal generated by power amplifier 106).

Thus, by utilizing autobias control circuit 102 to receive RF OUT 120 and output a control signal that is linearly proportional to the RF output power (in dBm) of RF OUT 120, the present invention achieves a power amplifier having an optimal quiescent current that is automatically adjusted as a function of RF output power over a continuous operating range of output power levels of power amplifier 106. As a result, the present invention achieves a linear power amplifier that can be biased to just meet minimum specified linearity, which is defined by the FCC or by customer specifications, over a continuous operating range of output power levels. By way of background, linearity may be defined by an adjacent-channel power ratio ("ACPR") specification. Thus, by utilizing autobias control circuit 102 to optimize quiescent current over a continuous operating range of output power levels of power amplifier 106, the present invention advantageously achieves a linear power amplifier having reduced current consumption over a continuous operating range of output power levels of the linear power amplifier.

Figure 2:
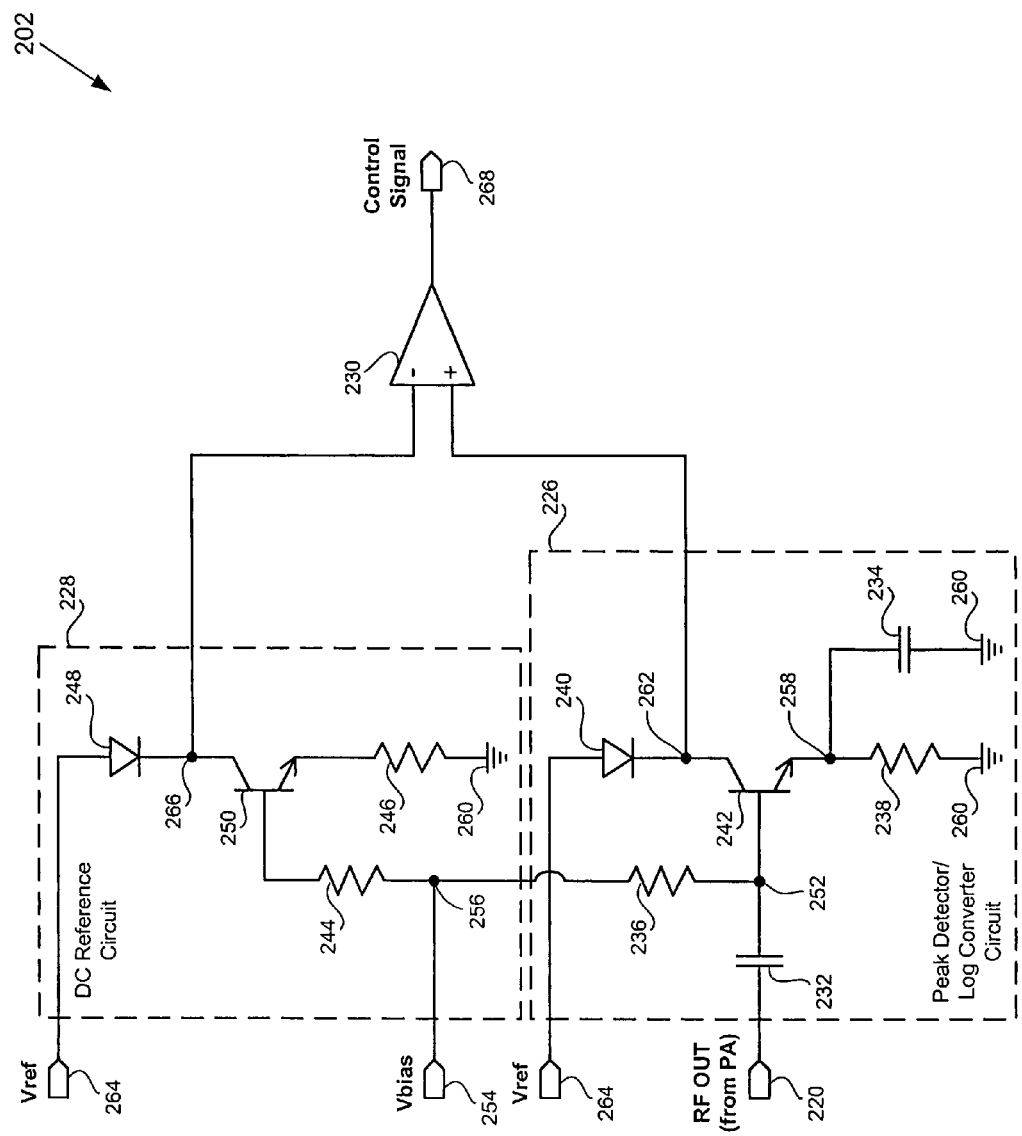
FIG. 2 illustrates a circuit diagram of an exemplary automatic bias control circuit in accordance with one embodiment of the present invention.

FIG. 2 shows a schematic diagram of an exemplary autobias control circuit in accordance with one embodiment of the present invention. Autobias control circuit 202 and RF OUT 220 in FIG. 2 correspond, respectively, to autobias control circuit 102 and RF OUT 120 in FIG. 1. Autobias control circuit 202 comprises peak detector/log converter circuit 226, DC reference circuit 228, and differential amplifier 230. Peak detector/log converter circuit 226 comprises capacitors 232 and 234, resistors 236 and 238, diode 240, and transistor 242. DC reference circuit 228 comprises resistors 244 and 246, diode 248, and transistor 250.

As shown in FIG. 2, RF OUT 220 (from power amplifier 106 in FIG. 1) is coupled to a first terminal of capacitor 232, which is also the input of peak detector/log converter circuit 226, and a second terminal of capacitor 232 is coupled to a first terminal of resistor 236 and the base of transistor 242 at node 252. Also shown in FIG. 2, a second terminal of resistor 236 is coupled to bias voltage ("Vbias") 256, which can be a DC bias voltage source having no AC component. Vbias 256 supplies an appropriate DC bias voltage to the base of transistor 242 via resistor 236. Further shown in FIG. 2, the emitter of transistor 242 is coupled to a first terminal of resistor 238 and a first terminal of capacitor 234 at node 258 and second terminals of resistor 238 and capacitor 234 are coupled to ground 260. Also shown in FIG. 2, the collector of transistor 242 is coupled to the cathode of diode 240 and the non-inverting input of differential amplifier 230 at node 262, which is also the output of peak detector/log converter circuit 226.

In the present embodiment, transistor 242 can be a can be an NPN bipolar transistor, which can comprise silicon. In other embodiments, transistor 242 can be an NPN silicon-germanium bipolar transistor, an NPN GaAs heterojunction bipolar transistor ("HBT"), a field effect transistor ("FET"), or other appropriate type of bipolar transistor. Diode 240 is a bipolar device that can comprise silicon, GaAs, or other appropriate semiconductor material. Further shown in FIG. 2, the anode of diode 240 is coupled to reference voltage ("Vref") 264, which can be a DC supply voltage having no AC component, such as VCC. Also shown in FIG. 2, a first terminal of resistor 244 is coupled to Vbias 254 at node 256 and a second terminal of resistor 244 is coupled to the base of transistor 250.

Further shown in FIG. 2, the emitter of transistor 250 is coupled to a first terminal of resistor 246 and the collector of transistor 250 is coupled to the cathode of diode 248 and an inverting input of differential amplifier 230 at node 266, which is also the output of DC reference circuit 228. Also shown in FIG. 2, a second terminal of resistor 246 is coupled to ground 260 and the anode of diode 248 is coupled to Vref 264. In the present embodiment, each of the components in DC reference circuit 228 are matched (i.e. are substantially similar in composition and operating characteristics) to a corresponding component in peak detector/log converter circuit 226. In particular resistor 244, resistor 246, transistor 250, and diode 248 in DC reference circuit 228 are matched, respectively, to resistor 236, resistor 238, transistor 242, and diode 240 in peak detector/log converter circuit 226.

Further shown in FIG. 2, the respective non-inverting and inverting inputs of differential amplifier 230 are coupled to nodes 262 and 266 and control signal 268 is generated at the output of differential amplifier 230, which is also the output of autobias control circuit 102. Differential amplifier 230 can be an operational amplifier and can be configured to receive the respective outputs of DC reference circuit 228 and peak detector/log converter circuit 226 at inverting and non-inverting inputs, subtract the output of DC reference circuit 228 from the output of peak detector/log converter circuit 226 to determine a difference voltage, amplify the difference voltage, and output the amplified difference voltage as control signal 268. In the present embodiment, control signal 268 can be a control voltage. In another embodiment, control signal 268 may be a control current.

The function and operation of autobias control circuit 202 will now be discussed. In DC reference circuit 228, which operates in a DC operating mode, resistor 244 provides sufficient bias voltage to the base of transistor 250 to cause a DC current to flow through resistor 246, transistor 250, and diode 248. The collector of transistor 250 determines an output DC voltage at node 266 (i.e. the output of DC reference circuit 228), which is equal to Vref 264 minus a voltage drop across diode 248. Peak detector/log converter circuit 226 is biased by resistor 236 at the same operating point as DC reference circuit 228. As a result, in a DC operating mode, the DC voltage outputted at node 262 by peak detector/log converter circuit 226 is substantially equal to the DC voltage outputted at node 266 by DC reference circuit 228. Thus, in the DC operating mode, the difference between the DC voltage at node 262, which is coupled to the non-inverting input of differential amplifier 230, and the DC voltage at node 266, which is coupled to the inverting input of differential amplifier 230, is approximately equal to zero.

In an RF operating mode (i.e. when RF IN 118 is applied to the input of power amplifier 106 in Figure), RF OUT 220 (i.e. the RF output signal generated at the output of power amplifier 106 in FIG. 1) is applied to the input of autobias control circuit 202 and coupled to the base of transistor 242. RF OUT 220 causes the base of transistor 242 to increase or decrease in voltage (i.e. causes the base of transistor 242 to be driven up or down) in response to a respective increase or decrease in amplitude of RF OUT 220. As RF OUT 220 increases in amplitude and drives the base of transistor 242 up, the voltage at the emitter of transistor 242 at node 258 increases and is stored by capacitor 234. As RF OUT 220 decreases in amplitude, the base of transistor 242 will be driven down to a sufficiently low voltage such that transistor 242 will turn off.

However, a decrease in amplitude of RF OUT 220 will not affect the voltage stored on capacitor 234 at node 258. As a result, transistor 242 operates as a peak detector, where the voltage stored on capacitor 234 corresponds to the peak amplitude of RF OUT 220. The value of capacitor 234 can be selected to prevent resistor 238 from draining charge off of capacitor 234 during the period when the amplitude of RF OUT 220 drops below the point at which transistor 242 turns off. Capacitor 234 and resistor 238 form an RC network having a time constant that determines the frequency response of the peak detector that is formed by transistor 242. As the voltage on capacitor 234 increases, the voltage on resistor 238 also increases, which causes a corresponding increase in DC current flowing through diode 240.

Thus, the voltage that is stored on capacitor 234, which corresponds to the peak amplitude of RF OUT 220, is converted to DC current that flows through diode 240, transistor 242, and resistor 238. The DC voltage at node 262 (i.e. the output of peak detector/log converter circuit 226) is equal to Vref 264 minus the voltage drop across diode 240. However, the voltage drop across diode 240 is logarithmically proportional to the DC current flowing through diode 240, which is proportional to the peak voltage of RF OUT 220, which is stored on capacitor 234. Thus, in the present embodiment, diode 240 is utilized as a logarithmic converter to convert the DC current flowing through diode 240 to a logarithmically proportional DC voltage across diode 240. Consequently, the DC voltage at node 262 is linearly proportional to the RF output power of RF OUT 220, as measured in dBm. However, the DC voltage at node 262 also depends on Vref 264 (i.e. the supply voltage) and process variations of components in peak detector/log converter circuit 226.

Differential amplifier 230 subtracts the DC voltage outputted at node 266 of DC reference circuit 228 from the DC voltage outputted at node 262 of peak detector/log converter circuit 226 to determine a difference voltage, which is amplified by differential amplifier 230 and outputted as control signal 268. As discussed above, each component of DC reference circuit 228 is matched to (i.e. forms a matched pair with) a corresponding component of peak detector/log converter circuit 226. Thus, by subtracting the DC voltage outputted at node 266 of DC reference circuit 228 from the DC voltage outputted at node 262 of peak detector/log converter circuit 226, differential amplifier 230 substantially eliminates the dependency on Vref 264 (i.e. the supply voltage) and component process variations in the DC voltage outputted by peak detector/log converter circuit 226. Thus, control signal 268, which is outputted by autobias control circuit 202, is linearly proportional to an RF output power of RF OUT 220, which is coupled to the input of autobias control circuit 202.

Thus, as discussed above, the present invention achieves an autobias control circuit that receives an RF output signal from a linear power amplifier and converts the RF output signal to a control signal that is linearly proportional to the RF output power of the RF output signal. By utilizing the control signal to cause the linear power amplifier to have a quiescent current that is linearly proportional to the control signal over a continuous operating range of output power levels of the linear power amplifier, the present invention advantageously achieves reduced current consumption over the continuous operating range of output power levels of the linear power amplifier. As a result, the present invention advantageously reduces battery drain and, thereby, extends battery life in wireless communications devices, such as cellular handsets, that utilize linear power amplifiers.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, automatic bias control circuit for power amplifiers has been described.

The invention claimed is:

1. An amplification module comprising:
a power amplifier configured to receive an RF input signal and provide an RF output signal;
an autobias control circuit coupled to said power amplifier and configured to receive and convert said RF output signal to a linear control signal;
wherein said linear control signal causing said power amplifier to have a quiescent current that increases substantially linearly in response to an increase in said RF output power of said RF output signal.

2. The amplification module of claim 1 further comprising a bias circuit, wherein said bias circuit couples said autobias control circuit to said power amplifier.

3. The amplification module of claim 2, wherein said bias circuit is configured to receive said linear control signal and provide a bias voltage to a bias input of said power amplifier, wherein said bias voltage is linearly proportional to said linear control signal.

4. The amplification module of claim 1, wherein said autobias control circuit comprises a peak detector/log converter circuit coupled to a first input of a differential amplifier, wherein said differential amplifier outputs said linear control signal.

5. The amplification module of claim 4, wherein said autobias control circuit further comprises a DC reference circuit coupled to a second input of said differential amplifier, wherein each of said plurality of components in said DC reference circuit is matched to a corresponding component in said peak detector/log converter circuit.

6. The amplification module of claim 4, wherein said peak detector/log converter circuit is configured to receive said RF output signal and convert said RF output signal to a first DC voltage, wherein said first DC voltage is linearly proportional to said RF output power of said RF output signal.

7. The amplification module of claim 6, wherein said differential amplifier substantially removes voltage variations in said first DC voltage caused by VCC.

8. An amplification module comprising:
an autobias control circuit configured to receive an RF output signal from a power amplifier and output a linear control signal;
a bias circuit configured to receive said linear control signal and provide a bias voltage to said power amplifier that varies in response to said linear control signal;
wherein said bias voltage causes said power amplifier to have a quiescent current that increases substantially linearly in response to an increase in RF output power of said RF output signal.

9. The amplification module of claim 8, wherein said linear control signal is linearly proportional to said RF output power of said RF output signal.

10. The amplification module of claim 8, wherein said autobias control circuit comprises a peak detector/log converter circuit coupled to a differential amplifier, wherein said peak detector/log converter circuit is configured to receive said RF output signal and convert said RF output signal to a first DC voltage.

11. The amplification module of claim 10, wherein said first DC voltage is linearly proportional to said RF output power of said RF output signal.

12. The amplification module of claim 10, wherein said differential amplifier is configured to amplify a difference between said first DC voltage and a second DC voltage and output said linear control signal.

13. The amplification module of claim 10, wherein said differential amplifier substantially removes voltage variations in said first DC voltage caused by VCC.

14. An autobias control circuit comprising:
a differential amplifier configured to receive a first DC voltage at a first input and output a control voltage, said first DC voltage being converted from an RF output signal generated by a power amplifier;
wherein said control voltage causes said power amplifier to have a quiescent current that increases substantially linearly in response to an increase in RF output power of said RF output signal.

15. The autobias control circuit of claim 14 further comprising a peak detector/log converter circuit configured to receive and convert said RF output signal to said first DC voltage.

16. The autobias control circuit of claim 14, wherein said first DC voltage is linearly proportional to said RF output power of said RF output signal.

17. The autobias control circuit of claim 14 further comprising a DC reference circuit, wherein said DC reference circuit provides a second DC voltage to a second input of said differential amplifier.

18. The autobias control circuit of claim 17, wherein said differential amplifier is further configured to amplify a difference between said first DC voltage and said second DC voltage and output said control voltage.

19. The autobias control circuit of claim 15, wherein said peak detector/log converter circuit comprises a transistor having a base coupled to said RF output signal and an emitter coupled to a capacitor at a first node, wherein said transistor causes a peak voltage of said RF output signal to be stored by said capacitor.

20. The autobias control circuit of claim 19, wherein said peak detector/log converter circuit further comprises a diode coupled to a collector of said transistor at a second node, wherein said first DC voltage is outputted by said peak detector/log converter circuit at said second node.

* * * * *